(12) United States Patent
Katayama (10) Patent No.: US 10,669,184 B2
(45) Date of Patent: Jun. 2, 2020

(54) GLASS SUBSTRATE AND LAMINATE USING SAME

(71) Applicant: Nippon Electric Glass Co., Ltd., Shiga (JP)

(72) Inventor: Hiroki Katayama, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 151 days.

(21) Appl. No.: 15/552,539

(22) PCT Filed: Jan. 22, 2016

(86) PCT No.: PCT/JP2016/051932
§ 371 (c)(1),
(2) Date: Aug. 22, 2017

(87) PCT Pub. No.: WO2016/136348
PCT Pub. Date: Sep. 1, 2016

(65) Prior Publication Data
US 2018/0339929 A1    Nov. 29, 2018

(30) Foreign Application Priority Data

Feb. 23, 2015    (JP) .................................. 2015-032455

(51) Int. Cl.
*B32B 3/02*        (2006.01)
*C03B 17/06*       (2006.01)
(Continued)

(52) U.S. Cl.
CPC ........ *C03B 17/064* (2013.01); *B23K 26/0006* (2013.01); *B23K 26/0622* (2015.10);
(Continued)

(58) Field of Classification Search
CPC ... C03B 17/064; C02C 23/0025; H01L 21/02; H01L 23/3107; H01L 24/96
See application file for complete search history.

(56) References Cited

U.S. PATENT DOCUMENTS

| | | | |
|---|---|---|---|
| 6,437,454 B1 | 8/2002 | Chiba et al. | |
| 2003/0048349 A1* | 3/2003 | Yamada | ................. B41M 5/262 |
| | | | 347/224 |
| 2012/0114921 A1 | 5/2012 | Tsuda | |

FOREIGN PATENT DOCUMENTS

| | | |
|---|---|---|
| JP | 2000-312983 | 11/2000 |
| JP | 2001-118757 | 4/2001 |

(Continued)

OTHER PUBLICATIONS

International Preliminary Report on Patentability dated Aug. 29, 2017 in International (PCT) Application No. PCT/JP2016/051932.
(Continued)

*Primary Examiner* — Elizabeth E Mulvaney
(74) *Attorney, Agent, or Firm* — Wenderoth, Lind & Ponack, L.L.P.

(57) ABSTRACT

A technical object of the present invention is to devise a glass substrate that is suitable for supporting a substrate to be processed to be subjected to high-density wiring and enables correct recognition of production information and the like, and a laminate using the glass substrate. In order to achieve the technical object, the glass substrate of the present invention has a total thickness variation of less than 2.0 μm and includes an information identification part formed of a plurality of dots.

13 Claims, 4 Drawing Sheets

(51) Int. Cl.
- *H01L 23/00* (2006.01)
- *C03C 23/00* (2006.01)
- *B23K 26/60* (2014.01)
- *B32B 17/06* (2006.01)
- *B23K 26/352* (2014.01)
- *B23K 26/0622* (2014.01)
- *B23K 26/00* (2014.01)
- *H01L 23/31* (2006.01)
- *H01L 21/56* (2006.01)
- *H01L 21/02* (2006.01)
- *B23K 26/359* (2014.01)
- *B23K 101/40* (2006.01)
- *B23K 101/42* (2006.01)
- *C03C 3/093* (2006.01)
- *C03C 3/091* (2006.01)
- *B23K 103/16* (2006.01)
- *B23K 103/00* (2006.01)

(52) U.S. Cl.
CPC .......... *B23K 26/355* (2018.08); *B23K 26/359* (2015.10); *B23K 26/60* (2015.10); *B32B 17/06* (2013.01); *C03C 23/001* (2013.01); *C03C 23/0025* (2013.01); *H01L 21/02* (2013.01); *H01L 21/02002* (2013.01); *H01L 21/561* (2013.01); *H01L 21/568* (2013.01); *H01L 23/3107* (2013.01); *H01L 23/3128* (2013.01); *H01L 24/96* (2013.01); *H01L 24/97* (2013.01); *B23K 2101/40* (2018.08); *B23K 2101/42* (2018.08); *B23K 2103/172* (2018.08); *B23K 2103/54* (2018.08); *B23K 2103/56* (2018.08); *C03C 3/091* (2013.01); *C03C 3/093* (2013.01); *H01L 2224/12105* (2013.01); *H01L 2924/3511* (2013.01)

(56) References Cited

FOREIGN PATENT DOCUMENTS

| | | |
|---|---|---|
| JP | 3694768 | 9/2005 |
| JP | 2008-56508 | 3/2008 |
| JP | 2013-149713 | 8/2013 |
| JP | 2014-31302 | 2/2014 |
| TW | 201338973 | 10/2013 |
| TW | 201441167 | 11/2014 |
| WO | 2013/047190 | 4/2013 |

OTHER PUBLICATIONS

Taiwanese Office Action dated Apr. 9, 2019 in corresponding Taiwanese patent application No. 10820321890, with English translation of Search Report.

International Search Report dated Apr. 26, 2016 in International Application No. PCT/JP2016/051932.

\* cited by examiner

Fig. 3

GLASS SUBSTRATE AND LAMINATE USING SAME

TECHNICAL FIELD

The present invention relates to a glass substrate and a laminate using the glass substrate, and more specifically, to a glass substrate to be used for supporting a substrate to be processed in a manufacturing process for a semiconductor package, and a laminate using the glass substrate.

BACKGROUND ART

Portable electronic devices, such as a cellular phone, a notebook-size personal computer, and a personal data assistance (PDA), are required to be downsized and reduced in weight. Along with this, a mounting space for semiconductor chips to be used in those electronic devices is strictly limited, and there is a problem of high-density mounting of the semiconductor chips. In view of this, in recent years, there has been an attempt to perform high-density mounting of a semiconductor package by a three-dimensional mounting technology, that is, by laminating semiconductor chips on top of another and connecting the semiconductor chips through wiring.

In addition, a conventional wafer level package (WLP) is manufactured by forming bumps into a wafer shape and dicing the wafer into chips. However, the conventional WLP has problems in that it is difficult to increase the number of pins, and chipping and the like of semiconductor chips are liable to occur because the semiconductor chips are mounted in a state in which the back surfaces thereof are exposed.

Therefore, as a new WLP, a fan-out type WLP has been proposed. In the fan-out type WLP, it is possible to increase the number of pins, and chipping and the like of semiconductor chips can be prevented by protecting end portions of the semiconductor chips.

The manufacturing method of the fan-out type WLP includes the step of molding a plurality of semiconductor chips with a sealing material of a resin, to thereby form a substrate to be processed, followed by arranging wiring on one surface of the substrate to be processed, the step of forming solder bumps, and the like.

Those steps involve heat treatment at about 200° C. to about 300° C., and hence there is a risk in that the sealing material may be deformed, and the substrate to be processed may change in dimension. When the substrate to be processed changes in dimension, it becomes difficult to arrange wiring at high density on one surface of the substrate to be processed, and it is also difficult to form the solder bumps accurately. Further, when the ratio of the semiconductor chips within the substrate to be processed is small and the ratio of the sealing material within the substrate to be processed is large, such tendency becomes remarkable.

CITATION LIST

Patent Literature 1: JP 2000-312983 A

SUMMARY OF INVENTION

Technical Problem

With regard to the above-mentioned problems, it is effective to use a glass substrate as a supporting substrate. The glass substrate is smoothened easily on the surface thereof and has stiffness. Accordingly, when the glass substrate is used, the stiffness of the whole of a laminate is increased, with the result that warping deformation of the substrate to be processed is suppressed easily, and the substrate to be processed can be supported strongly and accurately.

However, even when the glass substrate is used as a supporting substrate, it has been difficult to subject one of the surfaces of the substrate to be processed to high-density wiring in some cases.

In addition, when an information identification part (mark) as a two-dimensional code is formed (marked) on the surface of the glass substrate, production information and the like of the glass substrate can be managed and recognized. The information identification part is generally formed in a peripheral region of the glass substrate, and is recognized as a letter, a symbol, or the like by a human eye or the like. Further, it is probable that the information identification part of the glass substrate is automatically recognized by an optical element, such as a CCD camera. In this case, it is required that the information identification part can be correctly recognized also by an automated process.

As a method of forming the information identification part, for example, in Patent Literature 1, there is a disclosure of a method including: a first step of forming a film or an adhesion material on a surface of a material to be marked; and a second step of radiating a laser light beam to a part in which the film or the adhesion material is formed, to thereby form irregularities on the surface of the material to be marked in the course of removing the film or the adhesion material from the material to be marked. However, in the method disclosed in Patent Literature 1, the irregularities are formed on the surface of the glass substrate. As a result, the substrate to be processed cannot be supported with high accuracy, and it becomes difficult to arrange wiring at high density on one surface of the substrate to be processed.

The present invention has been made in view of the above-mentioned circumstances, and a technical object of the present invention is to devise a glass substrate that is suitable for supporting a substrate to be processed to be subjected to high-density wiring and enables correct recognition of production information and the like, and a laminate using the glass substrate.

Solution to Problem

The inventor of the present invention has repeatedly carried out various experiments. As a result, the inventor of the present invention has found that the above-mentioned technical object can be achieved by reducing the total thickness variation of the glass substrate and further forming a specific information identification part. Thus, the inventor of the present invention has proposed this finding as the present invention. That is, firstly, a glass substrate according to one embodiment of the present invention has a total thickness variation of less than 2.0 μm and comprises an information identification part formed of a plurality of dots. The "total thickness variation" as used herein refers to a difference between the maximum thickness and the minimum thickness of the entire glass substrate, and may be measured with, for example, SBW-331 ML/d manufactured by Kobelco Research Institute, Inc.

The glass substrate according to the embodiment of the present invention has a total thickness variation of less than 2.0 μm. When the total thickness variation is decreased to less than 2.0 μm, the accuracy of processing treatment can be easily enhanced. In particular, wiring accuracy can be enhanced, and hence high-density wiring can be performed.

In addition, the in-plane strength of the glass substrate is improved, and hence the glass substrate and the laminate are less liable to be broken. Further, the number of times of reuse (number of endurable uses) of the glass substrate can be increased.

The glass substrate according to the embodiment of the present invention comprises the information identification part formed of a plurality of dots. With this, in a manufacturing process for a semiconductor package, the production information and the like of the glass substrate can be automatically and correctly recognized by an optical element, such as a CCD camera.

Secondly, it is preferred that, in the glass substrate according to the embodiment of the present invention, the dots be formed by thermal shock through laser irradiation. With this, the tiny dots can be formed easily and simply without an adverse effect on the total thickness variation of the glass substrate.

Thirdly, it is preferred that, in the glass substrate according to the embodiment of the present invention, the dots be formed by cracks extending from an inside of the glass substrate to a surface layer thereof. With this, the tiny dots can be formed easily and simply without an adverse effect on the total thickness variation of the glass substrate.

Fourthly, it is preferred that, in the glass substrate according to the embodiment of the present invention, the dots adjacent to each other have a distance between centers of 100 μm or less. with this, a lot of information can be marked on a small region.

Fifthly, it is preferred that, in the glass substrate according to the embodiment of the present invention, the dots each have a diameter of from 0.5 μm to 10 μm. With this, a lot of information can be marked on a small region.

Sixthly, it is preferred that, in the glass substrate according to the embodiment of the present invention, the information identification part have input therein one kind or two or more kinds of information selected from a manufacturing company name of the glass substrate, a material of the glass substrate, a thermal expansion coefficient of the glass substrate, an outer diameter of the glass substrate, a thickness of the glass substrate, the total thickness variation of the glass substrate, a manufacturing date of the glass substrate, a delivery date of the glass substrate, and a serial number (individual identification number) of the glass substrate.

Seventhly, it is preferred that the glass substrate according to the embodiment of the present invention have a warpage level of 60 μm or less. The "warpage level" as used herein refers to the total of the absolute value of the maximum distance between the highest point and the least squares focal plane of the entire glass substrate, and the absolute value of the maximum distance between the lowest point and the least squares focal plane thereof, and may be measured with, for example, SBW-331ML/d manufactured by Kobelco Research Institute, Inc.

Eighthly, it is preferred that all or part of a surface of the glass substrate according to the embodiment of the present invention comprise a polished surface.

Ninthly, it is preferred that the glass substrate according to the embodiment of the present invention be formed by an overflow down-draw method, that is, the glass substrate further comprise a formed joined surface in an inside of glass.

Tenthly, it is preferred that the glass substrate according to the embodiment of the present invention have a contour of a wafer shape.

Eleventhly, it is preferred that the glass substrate according to the embodiment of the present invention be used for supporting a substrate to be processed in a manufacturing process for a semiconductor package.

Twelfthly, it is preferred that a laminate according to one embodiment of the present invention comprise at least a substrate to be processed and a glass substrate configured to support the substrate to be processed, the glass substrate comprising the above-mentioned glass substrate.

Thirteenthly, it is preferred that, in the laminate according to the embodiment of the present invention, the substrate to be processed comprise at least a semiconductor chip molded with a sealing material.

Fourteenthly, a method of manufacturing a glass substrate according to one embodiment of the present invention comprises the steps of:
(1) cutting a mother glass sheet to provide a glass substrate;
(2) polishing a surface of the glass substrate so that the glass substrate has a total thickness variation of less than 2.0 μm; and
(3) forming cracks extending from an inside of the glass substrate to a surface layer thereof by thermal shock through laser irradiation to form an information identification part formed of a plurality of dots.

DESCRIPTION OF EMBODIMENTS

A glass substrate of the present invention has a total thickness variation of preferably less than 2.0 μm, 1.5 μm or less, 1 μm or less, less than 1 μm, 0.8 μm or less, or from 0.1 μm to 0.9 μm, particularly preferably from 0.2 μm to 0.7 μm. As the total thickness variation becomes smaller, the accuracy of processing treatment is easily increased. In particular, the wiring accuracy can be increased, and hence high-density wiring can be performed. In addition, the strength of the glass substrate is increased, with the result that the glass substrate and a laminate are less liable to be broken. Further, the number of times of reuse (number of endurable uses) of the glass substrate can be increased.

The glass substrate of the present invention comprises an information identification part formed of a plurality of dots, and the dots are preferably formed by thermal shock through laser irradiation. Various lasers may be used as the laser. For example, a YAG laser, a semiconductor laser, a $CO_2$ laser, and the like may to used. In particular, from the viewpoint of forming the tiny dots, a semiconductor laser having a wavelength of from 300 nm to 400 nm is preferably used as the laser. In addition, the output of the laser is preferably set to from 30 mW to 75 mW. With this, the glass substrate is less liable to be broken, and cracks connecting between the dots are less liable to be generated.

In the glass substrate of the present invention, the dots are preferably formed by cracks extending from an inside of the glass substrate to a surface layer thereof. The cracks each have a depth of preferably from 1 μm to 70 μm, from 5 μm to 50 μm, or from 10 μm to 40 μm, particularly preferably from 20 μm to 40 μm. With this, the glass substrate is less liable to be broken, and the cracks connecting between the dots are less liable to be generated. However, when the cracks have excessively large depths, the glass substrate is liable to be broken.

The dots adjacent to each other have a distance between centers of preferably 100 μm or less, 60 μm or less, 50 μm or less, or 40 μm or less, particularly preferably from 15 μm to 35 μm. The dots each have a diameter of preferably from 0.5 μm to 10 μm, particularly preferably from 1 μm to 5 μm. With this, a lot of information can be marked on a small region. However, when the dots adjacent to each other have an excessively small distance between centers, the cracks are liable to propagate between the dots. In addition, when the dots have excessively large diameters, the cracks are liable to propagate between the dots.

In the glass substrate of the present invention, the information identification part preferably has input therein production information. For example, from the viewpoint of production management, the information identification part preferably has input therein one kind or two or more kinds of information selected from a manufacturing company name of the glass substrate, a material of the glass substrate, a thermal expansion coefficient of the glass substrate, an outer diameter of the glass substrate, a thickness of the glass substrate, the total thickness variation of the glass substrate, a manufacturing date of the glass substrate, a delivery date of the glass substrate, and a serial number of the glass substrate.

The warpage level is preferably 60 μm or less, 55 μm or less, 50 μm or less, or from 1 μm to 45 μm, particularly preferably from 5 μm to 40 μm. As the warpage level becomes smaller, the accuracy of processing treatment is easily increased. In particular, the wiring accuracy can be increased, and hence high-density wiring can be performed. Further, the number of times of reuse (number of endurable uses) of the glass substrate can be increased.

The arithmetic average roughness Ra of the surface is preferably 10 nm or less, 5 nm or less, 2 nm or less, or 1 nm or less, particularly preferably 0.5 nm or less. As the arithmetic average roughness Ra of the surface becomes smaller, the accuracy of the processing treatment can be enhanced easily. In particular, the wiring accuracy can be enhanced, and hence high-density wiring can be performed. In addition, the strength of the glass substrate is improved, and hence the glass substrate and the laminate are less liable to be broken. Further, the number of times of reuse (number of times of support) of the glass substrate can be increased. The "arithmetic average roughness Ra" may be measured with an atomic force microscope (AFM).

The glass substrate of the present invention may be used while all or part of a surface thereof remains unpolished, but it is preferred that all or part of the surface of the glass substrate of the present invention be a polished surface. In terms of an area ratio, it is more preferred that 50% or more of the surface be a polished surface, it is still more preferred that 70% or more of the surface be a polished surface, and it is particularly preferred that 90% or more of the surface be a polished surface. With this, the total thickness variation can be easily reduced, and the warpage level can also be easily reduced.

As a method for the polishing treatment, various methods may be adopted. However, a method involving sandwiching both surfaces of a glass substrate with a pair of polishing pads and subjecting the glass substrate to polishing treatment while rotating the glass substrate and the pair or polishing pads together is preferred. Further, it is preferred that the pair of polishing pads have different outer diameters, and it is preferred that the polishing treatment be performed so that part of the glass substrate intermittently extends off the polishing pads during polishing. With this, the total thickness variation can be easily reduced, and the warpage level can also be easily reduced. In the polishing treatment, a polishing depth is not particularly limited, but the polishing depth is preferably 50 μm or less, 30 μm or less, or 20 μm or less, particularly preferably 10 μm or less. As the polishing depth becomes smaller, the productivity of the glass substrate is improved.

The glass substrate of the present invention preferably has a wafer shape (substantially perfectly circular shape), and the diameter thereof is preferably 100 mm or more and 500 mm or less, particularly preferably 150 mm or more and 450 mm or less. With this, the glass substrate is easily applied to a manufacturing process for a semiconductor package. As necessary, the glass substrate may be processed into other shapes, for example, a rectangular shape.

In the glass substrate of the present invention, the thickness is preferably less than 2.0 mm, 1.5 mm or less, 1.2 mm or less, 1.1 mm or less, or 1.0 mm or less, particularly preferably 0.9 mm or less. As the thickness becomes smaller, the mass of the laminate is reduced, and hence a handling property is enhanced. Meanwhile, when the thickness is excessively small, the strength of the glass substrate itself decreases, and hence the glass substrate does not easily serve a function of a supporting substrate. Thus, the thickness is preferably 0.1 mm or more, 0.2 mm or more, 0.3 mm or more, 0.4 mm or more, 0.5 mm or more, or 0.6 mm or more, particularly preferably more than 0.7 mm.

It is preferred that the glass substrate of the present invention have the following characteristics.

In the glass substrate of the present invention, it is preferred that the average thermal expansion coefficient within a temperature range of from 30° C. to 380° C. be $0 \times 10^{-7}/°$ C. or more and $165 \times 10^{-7}/°$ C. or less. With this, the thermal expansion coefficients of a substrate to be processed and the glass substrate are easily matched with each other. When the thermal expansion coefficients of the substrate to be processed and the glass substrate are matched with each other, a change in dimension (in particular, warping deformation) of the substrate to be processed during the processing treatment is suppressed easily. As a result, wiring can be arranged at high density on one surface of the substrate to be processed, and solder bumps can also be formed thereon accurately. The "average thermal expansion coefficient within a temperature range of from 30° C. to 380° C." may be measured with a dilatometer.

It is preferred that the average thermal expansion coefficient within a temperature range of from 30° C. to 380° C. be increased when the ratio of semiconductor chips within the substrate to be processed is small and the ratio of a sealing material within the substrate to be processed is large. Meanwhile, it is preferred that the average thermal expansion coefficient be decreased when the ratio of the semiconductor chips within the substrate to be processed is large and the ratio of the sealing material within the substrate to be processed is small.

When the average thermal expansion coefficient within a temperature range of from 30° C. to 380° C. is set to $0\times10^{-7}$/° C. or more and less than $50\times10^{-7}$/° C., the glass substrate preferably comprises as a glass composition, in terms of mass %, 55% to 75% of $SiO_2$, 15% to 30% of $Al_2O_3$, 0.1% to 6% of $Li_2O$, 0% to 8% of $Na_2O+K_2O$, and 0% to 10% of $MgO+CaO+SrO+BaO$, or preferably comprises 55% to 75% of $SiO_2$, 10% to 30% of $Al_2O_3$, 0% to 0.3% of $Li_2O+Na_2O+K_2O$, and 5% to 20% of $MgO+CaO+SrO+BaO$. When the average thermal expansion coefficient within a temperature range of from 30° C. to 380° C. is set to $50\times10^{-7}$/° C. or more and less than $75\times10^{-7}$/° C., the glass substrate preferably comprises as a glass composition, in terms of mass %, 55% to 70% of $SiO_2$, 3% to 15% of $Al_2O_3$, 5% to 20% of $B_2O_3$, 0% to 5% of MgO, 0% to 10% of CaO, 0% to 5% of SrO, 0% to 5% of BaO, 0% to 5% of ZnO, 5% to 15% of $Na_2O$, and 0% to 10% of $K_2O$. When the average thermal expansion coefficient within a temperature range of from 30° C. to 380° C. is set to $75\times10^{-7}$/° C. or more and $85\times10^{-7}$/° C. or less, the glass substrate preferably comprises as a glass composition, in terms of mass %, 60% to 75% of $SiO_2$, 5% to 15% of $Al_2O_3$, 5% to 20% of $B_2O_3$, 0% to 5% of MgO, 0% to 10% of CaO, 0% to 5% of SrO, 0% to 5% of BaO, 0% to 5% of ZnO, 7% to 16% of $Na_2O$, and 0% to 8% of $K_2O$. When the average thermal expansion coefficient within a temperature range of from 30° C. to 380° C. is set to more than $85\times10^{-7}$/° C. and $120\times10^{-7}$/° C. or less, the glass substrate preferably comprises as a glass composition, in terms of mass %, 55% to 70% of $SiO_2$, 3% to 13% of $Al_2O_3$, 2% to 8% of $B_2O_3$, 0% to 5% of MgO, 0% to 10% of CaO, 0% to 5% of SrO, 0% to 5% of BaO, 0% to 5% of ZnO, 10% to 21% of $Na_2O$, and 0% to 5% of $K_2O$. When the average thermal expansion coefficient within a temperature range of from 30° C. to 380° C. is set to more than $120\times10^{-7}$/° C. and $165\times10^{-7}$/° C. or less, the glass substrate preferably comprises as a glass composition, in terms of mass %, 53% to 65% of $SiO_2$, 3% to 13% of $Al_2O_3$, 0% to 5% of $B_2O_3$, 0.1% to 6% of MgO, 0% to 10% of CaO, 0% to 5% of SrO, 0% to 5% of BaO, 0% to 5% of ZnO, 20% to 40% of $Na_2O+K_2O$, 12% to 21% of $Na_2O$, and 7% to 21% of $K_2O$. With this, the thermal expansion coefficient is regulated easily within a desired range, and devitrification resistance is enhanced. Therefore, a glass substrate having a small total thickness variation is formed easily.

The Young's modulus is preferably 65 GPa or more, 67 GPa or more, 68 GPa or more, 69 GPa or more, 70 GPa or more, 71 GPa or more, or 72 GPa or more, particularly preferably 73 GPa or more. When the Young's modulus is excessively low, it becomes difficult to maintain the stiffness of the laminate, and the deformation, warpage, and breakage of the substrate to be processed are liable to occur.

The liquidus temperature is preferably less than 1,150° C., 1,120° C. or less, 1,100° C. or less, 1,080° C. or less, 1,050° C. or less, 1,010° C. or less, 980° C. or less, 960° C. or less, or 950° C. or less, particularly preferably 940° C. or less. With this, a mother glass sheet is formed easily by a down-draw method, in particular, an overflow down-draw method. Therefore, a glass substrate having a small thickness is manufactured easily, and the thickness variation after forming can be reduced. Further, in a manufacturing process for the glass substrate, a situation in which a devitrified crystal is generated to decrease the productivity of the glass substrate is prevented easily. The "liquidus temperature" may be calculated by loading glass powder that has passed through a standard 30-mesh sieve (500 μm) and remained on a 50-mesh sieve (300 μm) into a platinum boat, then keeping the glass powder for 24 hours in a gradient heating furnace, and measuring a temperature at which crystals of glass are deposited.

The liquidus viscosity is preferably $10^{4.6}$ dPa·s or more, $10^{5.0}$ dPa·s or more, $10^{5.2}$ dPa·s or more, $10^{5.4}$ dPa·s or more, or $10^{5.6}$ dPa·s or more, particularly preferably $10^{5.8}$ dPa·s or more. With this, a mother glass sheet is formed easily by a down-draw method, in particular, an overflow down-draw method. Therefore, a glass substrate having a small thickness is manufactured easily, and the thickness variation after forming can be reduced. Further, in a manufacturing process for the glass substrate, a situation in which a devitrified crystal is generated to decrease the productivity of the glass substrate is prevented easily. The "liquidus viscosity" may be measured by a platinum sphere pull up method. The liquidus viscosity is an indicator of formability. As the liquidus viscosity becomes higher, the formability is enhanced.

The temperature at $10^{2.5}$ dPa·s is preferably 1,580° C. or less, 1,500° C. or less, 1,450° C. or less, 1,400° C. or less, or 1,350° C. or less, particularly preferably from 1,200° C. to 1,300° C. When the temperature at $10^{2.5}$ dPa·s increases, meltability is degraded, and the manufacturing cost of the glass substrate rises. The "temperature at $10^{2.5}$ dPa·s" may be measured by the platinum sphere pull up method. The temperature at $10^{2.5}$ dPa·s corresponds to a melting temperature. As the melting temperature becomes lower, the meltability is enhanced.

The glass substrate of the present invention is preferably formed by a down-draw method, in particular, an overflow down-draw method. The overflow down-draw method refers to a method in which a molten glass is caused to overflow from both sides of a heat-resistant, trough-shaped structure, and the overflowing molten glasses are subjected to down-draw downward at the lower end of the trough-shaped structure while being joined, to thereby manufacture a mother glass sheet. When a glass substrate is produced by the overflow down-draw method, surfaces that are to serve as the surfaces of the glass substrate are formed in a state of free surfaces without being brought into contact with the trough-shaped refractory. Therefore, a glass substrate having a small thickness is manufactured easily, and the thickness variation can be reduced without surface polishing. Alternatively, with slight polishing, the total thickness variation can be reduced to less than 2.0 μm, particularly to less than 1.0 μm. As a result, the manufacturing cost of the glass substrate can be reduced.

As a method of forming the glass substrate, besides the overflow down-draw method, for example, a slot down method, a redraw method, a float method, or the like may also be adopted.

It is preferred that the surface of the glass substrate of the present invention be polished after its formation by the overflow down-draw method. With this, the thickness variation can be easily controlled to 2 μm or less, or 1 μm or less, particularly to less than 1 μm.

It is preferred that the glass substrate of the present invention not be subjected to ion exchange treatment and not have a compressive stress layer on the surface thereof. When the glass substrate is subjected to the ion exchange treatment, the manufacturing cost of the glass substrate rises. Further, when the glass substrate is subjected to the ion exchange treatment, it becomes difficult to reduce the total thickness variation of the glass substrate. The glass substrate of the present invention does not exclude the mode of being subjected to the ion exchange treatment, to thereby form a compressive stress layer on the surface thereof. From the viewpoint of increasing mechanical strength, it is preferred that the glass substrate be subjected to the ion exchange treatment, to thereby form a compressive stress layer on the surface thereof.

A preferred method of manufacturing a glass substrate of the present invention comprises the steps of: (1) cutting a mother glass sheet to provide a glass substrate; (2) polishing a surface of the glass substrate so that the glass substrate has a total thickness variation of less than 2.0 µm; and (3) forming cracks extending from an inside of the glass substrate to a surface layer thereof by thermal shock through laser irradiation to form an information identification part formed of a plurality of dots. Here, the technical features (preferred configuration and effects) of the method of manufacturing a glass substrate of the present invention overlap the technical features of the glass substrate of the present invention. Thus, the details of the overlapping portions are omitted in this description.

The method of manufacturing a glass substrate comprises the step of cutting a mother glass sheet to provide a glass substrate. As a method of cutting the mother glass sheet, various methods may be adopted. For example, a method of cutting a mother glass sheet through thermal shock during laser irradiation, and a method involving subjecting a mother glass sheet to scribing and cutting the resultant by bending are available.

It is preferred that the method of manufacturing a glass substrate comprise the step of annealing the glass substrate after cutting the mother glass sheet to provide the glass substrate. From the viewpoint of reducing the warpage level of the glass substrate, the annealing temperature is preferably equal to or more than the softening point of the glass substrate, and the retention time at the annealing temperature is preferably 30 minutes or more. The annealing may be performed in a heat treatment furnace, such as an electric furnace.

The method of manufacturing a glass substrate comprises the step of polishing the surface of the glass substrate so that the glass substrate has a total thickness variation of less than 2.0 µm, and a preferred mode of this step is as described above.

The method of manufacturing a glass substrate comprises the step of forming cracks extending from an inside of the glass substrate to a surface layer thereof by thermal shock through laser irradiation to form an information identification part formed of a plurality of dots. A preferred mode of this step is as described above.

A laminate of the present invention comprises at least a substrate to be processed and a glass substrate configured to support the substrate to be processed, the glass substrate comprising the above-mentioned glass substrate. Here, the technical features (preferred configuration and effects) of the laminate of the present invention overlap the technical features of the glass substrate of the present invention. Thus, the details of the overlapping portions are omitted in this description.

It is preferred that the laminate of the present invention comprise an adhesive layer between the substrate to be processed and the glass substrate. It is preferred that the adhesive layer be formed of a resin, and for example, a thermosetting resin, a photocurable resin (in particular, a UV-curable resin), and the like are preferred. In addition, it is preferred that the adhesive layer have heat resistance that withstands the heat treatment in the manufacturing process for a semiconductor package. With this, the adhesive layer is less liable to be melted in the manufacturing process for a semiconductor package, and the accuracy of the processing treatment can be enhanced. A UV-curable tape may also be used as the adhesive layer in order to fix the substrate to be processed and the glass substrate easily.

It is preferred that the laminate of the present invention further comprise a peeling layer between the substrate to be processed and the glass substrate, more specifically, between the substrate to be processed and the adhesive layer. With this, after the substrate to be processed is subjected to predetermined processing treatment, the substrate to be processed is easily peeled from the glass substrate. From the viewpoint of productivity, it is preferred that the substrate to be peeled from the glass substrate through use of irradiation light, such as laser light. An infrared laser light source, such as a YAG laser (wavelength of 1,064 nm) and a semiconductor laser (wavelength of from 780 nm to 1,300 nm), may be used as a laser light source. In addition, a resin degradable by infrared laser irradiation may be used for the peeling layer. In addition, a substance that absorbs infrared light efficiently and converts the light into heat may also be added to the resin. For example, carbon black, graphite powder, metal powder fine particles, a dye, a pigment, and the like may also be added to the resin.

The peeling layer is formed of a material in which "in-layer peeling" or "interfacial peeling" occurs through use of irradiation light, such as laser light. That is, the peeling layer is formed of a material in which the interatomic or intermolecular binding force between atoms or molecules is lost or reduced to cause ablation or the like, to thereby cause peeling, through irradiation with light having predetermined intensity. There are the case where components contained in the peeling layer turn into a gas to be released, to thereby cause separation, through irradiation with irradiation light, and the case where the peeling layer absorbs light to turn into a gas and the vapor thereof is released, to thereby cause separation.

In the laminate of the present invention, it is preferred that the glass substrate be larger than the substrate to be processed. With this, even when the center positions of the substrate to be processed and the glass substrate are slightly separated from each other at a time when the substrate to be processed and the glass substrate are supported, an edge portion of the substrate to be processed is less liable to extend off from the glass substrate.

A method of manufacturing a semiconductor package using the glass substrate of the present invention comprises the step of preparing a laminate including at least a substrate to be processed and a glass substrate configured to support the substrate to be processed. The laminate including at least a substrate to be processed and a glass substrate configured to support the substrate to be processed has the above-mentioned material construction. The above-mentioned forming method may be adopted as a method of forming the glass substrate.

It is preferred that the method of manufacturing a semiconductor package further comprise the step of conveying the laminate. With this, the treatment efficiency of the processing treatment can be enhanced. The "step of conveying the laminate" and the "step of subjecting the substrate to be processed to processing treatment" are not required to be performed separately, and may to performed simultaneously.

In the method of manufacturing a semiconductor package, it is preferred that the processing treatment be treatment involving arranging wiring on one surface of the substrate to be processed or treatment involving forming solder bumps on one surface of the substrate to be processed. In the method of manufacturing a semiconductor package, during the treatment, the substrate to be processed is less liable to be changed in dimension, and hence those steps can be performed properly.

Besides the foregoing, the processing treatment may be any of treatment involving mechanically polishing one surface (in general, the surface on an opposite side to the glass substrate) of the substrate to be processed, treatment involving subjecting one surface (in general, the surface on an opposite side to the glass substrate) of the substrate to be processed to dry etching, and treatment involving subjecting one surface (in general, the surface on an opposite side to the glass substrate) of the substrate to be processed to wet etching. In the method of manufacturing a semiconductor package of the present invention, warpage is less liable to occur in the substrate to be processed, and the stiffness of the laminate can be maintained. As a result, the processing treatment can be performed properly.

The present invention is further described with reference to the drawings.

Figure 1:
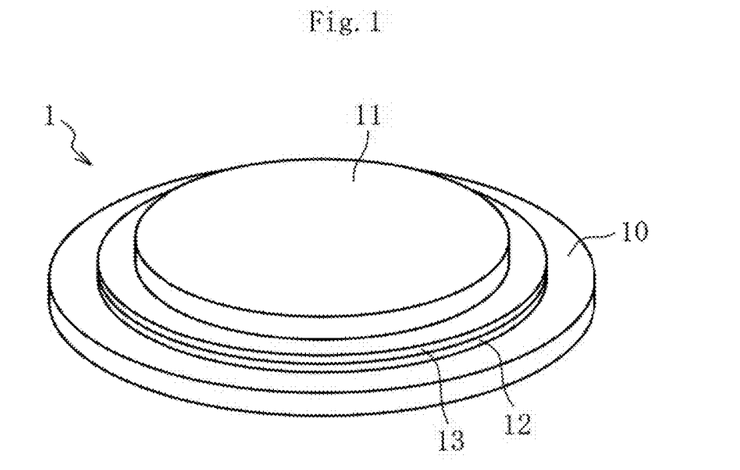
FIG. 1 is a conceptual perspective view for illustrating an example of a laminate of the present invention.

FIG. 1 is a conceptual perspective view for illustrating an example of a laminate 1 of the present invention. In FIG. 1, the laminate 1 comprises a glass substrate 10 and a substrate 11 to be processed. The glass substrate 10 is bonded onto the substrate 11 to be processed so as to prevent a dimensional change, particularly warping deformation, of the substrate 11 to be processed. A peeling layer 12 and an adhesive layer 13 are formed between the glass substrate 10 and the substrate 11 to be processed. The peeling layer 12 is held in contact with the glass substrate 10, and the adhesive layer 13 is held in contact with the substrate 11 to be processed.

As is understood from FIG. 1, the laminate 1 comprises the glass substrate 10, the peeling layer 12, the adhesive layer 13, and the substrate 11 to be processed, which are laminated in the stated order. The shape of the glass substrate 10 is determined depending on the substrate 11 to be processed, and in FIG. 1, both the glass substrate 10 and the substrate 11 to be processed have a substantially disc shape. For example, a resin degradable by laser irradiation may be used for the peeling layer 12. In addition, a substance that absorbs laser light efficiently and converts the light into heat may also be added to the resin. Examples thereof include carbon black, graphite powder, metal powder fine particles, a dye, and a pigment. The peeling layer 12 is formed by plasma CVD, spin coating using a sol-gel method, or the like. The adhesive layer 13 is made of a resin and is formed through application, for example, by any of various printing methods, an ink jet method, a spin coating method, a roll coating method, or the like. In addition, a UV-curable tape may also be used. The adhesive layer 13 is removed by being dissolved in a solvent or the like after the glass substrate 10 is peeled from the substrate 11 to be processed through use of the peeling layer 12. The UV-curable tape may be removed by a peeling tape after UV irradiation.

Figure 2A:
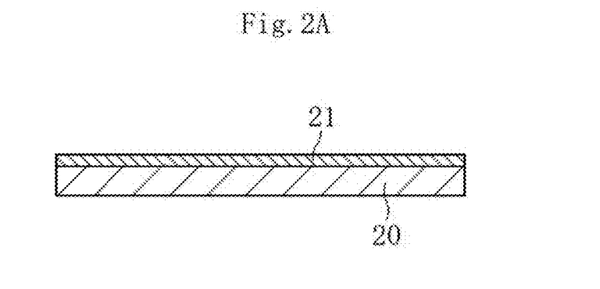
FIG. 2A is a conceptual sectional view for illustrating part of a manufacturing process for a fan-out type WLP.
Figure 2B:
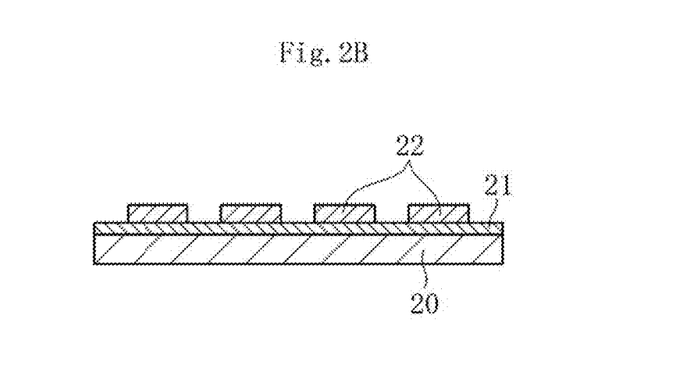
FIG. 2B is a conceptual sectional view for illustrating part of the manufacturing process for a fan-out type WLP.
Figure 2C:
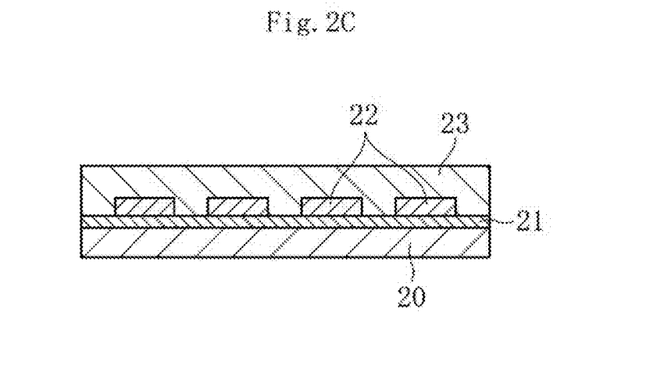
FIG. 2C is a conceptual sectional view for illustrating part of the manufacturing process for a fan-out type WLP.
Figure 2D:
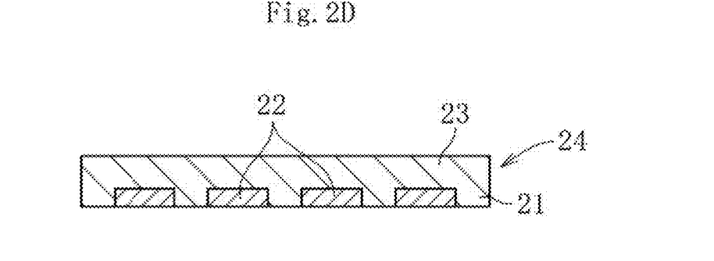
FIG. 2D is a conceptual sectional view for illustrating part of the manufacturing process for a fan-out type WLP.
Figure 2E:
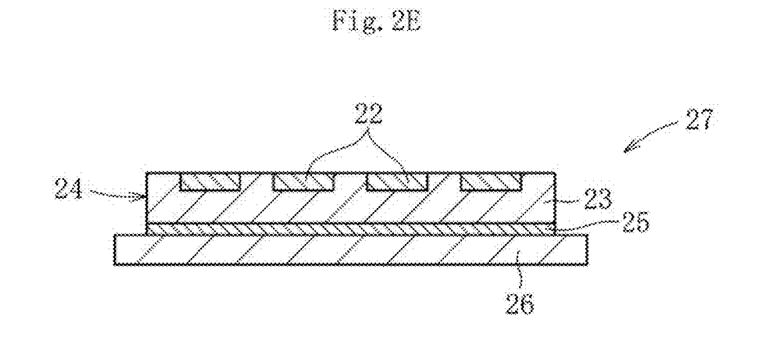
FIG. 2E is a conceptual sectional view for illustrating part of the manufacturing process for a fan-out type WLP.
Figure 2F:
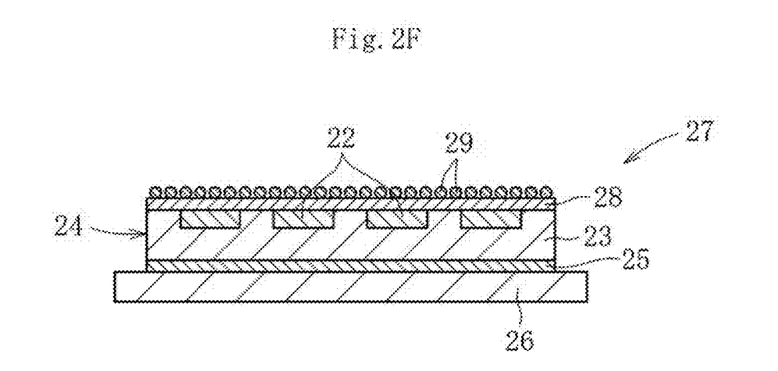
FIG. 2F is a conceptual sectional view for illustrating part of the manufacturing process for a fan-out type WLP.
Figure 2G:
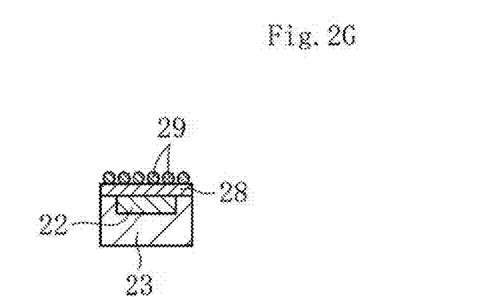
FIG. 2G is a conceptual sectional view for illustrating part of the manufacturing process for a fan-out type WLP.

FIG. 2A to FIG. 2G are conceptual sectional views for illustrating a manufacturing process for a fan-out type WLP. FIG. 2A is an illustration of a state in which an adhesive layer 21 is formed on one surface of a supporting member 20. As necessary, a peeling layer may be formed between the supporting member 20 and the adhesive layer 21. Next, as illustrated in FIG. 2B, a plurality of semiconductor chips 22 are bonded onto the adhesive layer 21. In this case, an active surface of each semiconductor chip 22 is brought into contact with the adhesive layer 21. Then, as illustrated in FIG. 2C, the semiconductor chips 22 are molded with a sealing material 23 of a resin. As the sealing material 23, a material having less change in dimension after compression molding and having less change in dimension during formation of wiring is used. Then, as illustrated in FIG. 2D and FIG. 2E, a substrate 24 to be processed having the semiconductor chips 22 molded therein is separated from the supporting member 20 and is adhesively fixed onto a glass substrate 26 through intermediation of an adhesive layer 25. In this case, in the surface of the substrate 24 to be processed, the surface on an opposite side to the surface in which the semiconductor chips 22 are buried is arranged on the glass substrate 26 side. Thus, a laminate 27 can be obtained. As necessary, a peeling layer may be formed between the adhesive layer 25 and the glass substrate 26. After the obtained laminate 27 is conveyed, as illustrated in FIG. 2F, a wiring 28 is formed on the surface of the substrate 24 to be processed in which the semiconductor chips 22 are buried, and then a plurality of solder bumps 29 are formed. Finally, after the substrate 24 to be processed is separated from the glass substrate 26, the substrate 24 to be processed is cut for each semiconductor chip 22 to be used in a later packaging step (FIG. 2G).

EXAMPLES

Example 1

Now, the present invention is described with reference to Examples. However, Examples below are merely examples, and the present invention is by no means limited to the following Examples.

Glass raw materials were blended so as to comprise as a glass composition, in terms of mass %, 65.2% of $SiO_2$, 8% of $Al_2O_3$, 10.5% of $B_2O_3$, 11.5% of $Na_2O$, 3.4% of CaO, 1% of ZnO, 0.3% of $SnO_2$, and 0.1% of $Sb_2O_3$. After that, the resultant was loaded into a glass melting furnace to be melted at from 1,500° C. to 1,600° C. Then, the molten glass was supplied into an overflow down-draw forming apparatus to be formed to a thickness of 0.7 mm.

Next, the obtained mother glass sheet was hollowed out into a wafer shape to provide a glass substrate, and the surface of the glass substrate was subjected to polishing treatment with a polishing apparatus to reduce the total thickness variation of the glass substrate. Specifically, both surfaces of the glass substrate were sandwiched between a pair of polishing pads having different outer diameters, and both the surfaces of the glass substrate were subjected to polishing treatment while the glass substrate and the pair of polishing pads were rotated together. Part of the glass substrate was caused to extend off from the polishing pads intermittently during the polishing treatment. The polishing pads were made of urethane. The average particle diameter of a polishing slurry used in the polishing treatment was 2.5 μm, and the polishing speed was 15 m/min.

Figure 3:
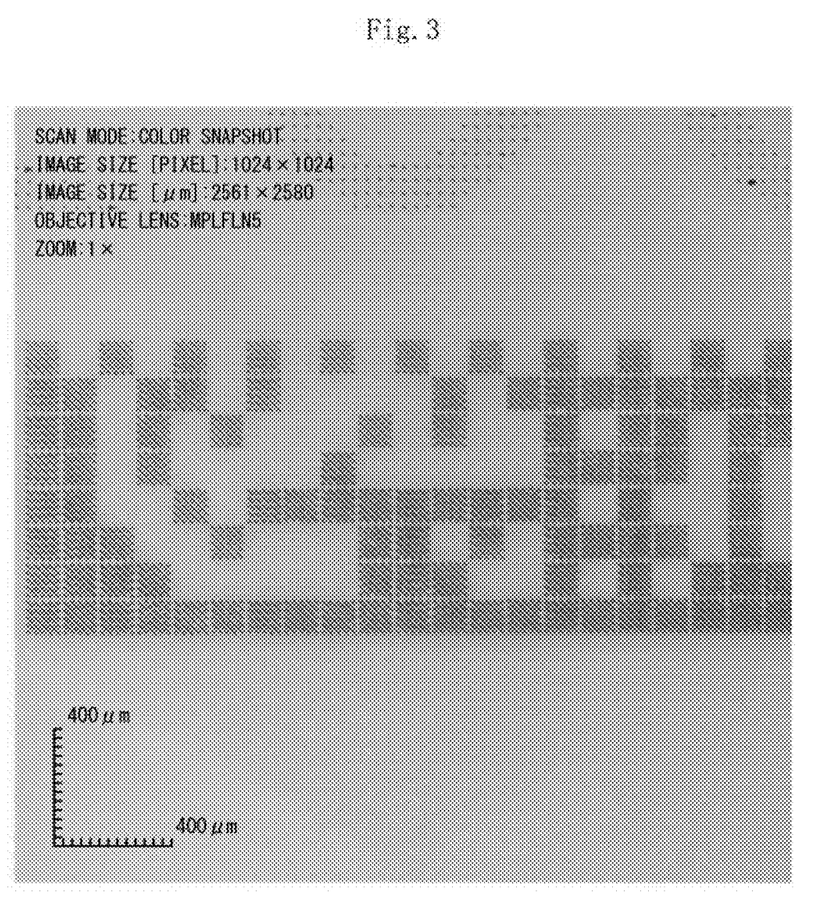
FIG. 3 is a micrograph of an information identification part of a glass substrate according to [Example 1].

Subsequently, a semiconductor laser (laser output: 50 mW, pulse width: several nanoseconds) having a wavelength of 349 μm was radiated to the glass substrate at a depth of 30 μm, and thus an information identification part formed of a plurality of dots was formed on the surface of the glass substrate by thermal shock. Herein, the distance between centers of the dots was set to 25 μm, and the diameter of each dot was set to 3 μm. The dots were formed by cracks extending from an inside of the glass substrate to a surface layer thereof. FIG. 3 is a micrograph of the information identification part, and black points in the micrograph are the dots. The information identification part was able to be recognized by an optical element, such as a CCD camera, and besides, no cracks connecting between the dots were observed.

Finally, the obtained glass substrate was measured for a total thickness variation and a warpage level. As a result, it was found that the total thickness variation was 0.55 μm and the warpage level was 30 μm.

Example 2

First, glass raw materials were blended so as to have a glass composition of each of Sample Nos. 1 to 7 shown in Table 1. After that, the resultant was loaded into a glass melting furnace to be melted at from 1,500° C. to 1,600° C. Then, the molten glass was supplied into an overflow down-draw forming apparatus to be formed to a thickness of 0.8 mm. Next, under the same conditions as those of [Example 1], the mother glass sheet was hollowed out into a wafer shape, and then, the surface of the obtained glass substrate was subjected to polishing treatment with a polishing apparatus to reduce the total thickness variation of the glass substrate. Further, an information identification part was formed on the glass substrate with a semiconductor laser. Each of the obtained glass substrates was evaluated for an average thermal expansion coefficient $\alpha_{30-380}$ within a temperature range of from 30° C. to 380° C., a density ρ, a strain point Ps, an annealing point Ta, a softening point Ts, a temperature at a viscosity at high temperature of $10^{4.0}$ dPa·s, a temperature at a viscosity at high temperature of $10^{3.0}$ dPa·s, a temperature at a viscosity at high temperature of $10^{2.5}$ dPa·s, a temperature at a viscosity at high temperature of $10^{2.0}$ dPa·s, a liquidus temperature TL, and a Young's modulus E. Each of the glass substrates after the cutting was measured for a total thickness variation and a warpage level, and as a result, it was found that the total thickness variation was 3 μm and the warpage level was 70 μm. Meanwhile, each of the glass substrates after the formation of the information identification part was measured for a total thickness variation and a warpage level, and as a result, it was found that the total thickness variation was 0.45 μm and the warpage level was 35 μm.

The average thermal expansion coefficient $\alpha_{30-380}$ within a temperature range of from 30° C. to 380° C. is a value measured with a dilatometer.

The density ρ is a value measured by a well-known Archimedes method.

The strain point Ps, the annealing point Ta, and the softening point Ts are values obtained by measurement based on the method of ASTM C336.

The temperatures at viscosities at high temperature of $10^{4.0}$ dPas, $10^{3.0}$ dPas, $10^{2.5}$ dPas and $10^{2.0}$ dPas are values obtained by measurement by a platinum sphere pull up method.

The liquidus temperature TL is a value obtained by loading glass powder that has passed through a standard 30-mesh sieve (500 μm) and remained on a 50-mesh sieve (300 μm) into a platinum boat, keeping the glass powder for 24 hours in a gradient heating furnace, and then measuring, by microscopic observation, a temperature at which crystals of glass are deposited.

The Young's modulus E is a value measured by a resonance method.

REFERENCE SIGNS LIST 1, 27 laminate
10, 26 glass substrate
11, 24 substrate to be processed
12 peeling layer
13, 21, 25 adhesive layer
20 supporting member
22 semiconductor chip
23 sealing material
28 wiring
29 solder bump

The invention claimed is:
1. A glass substrate, which has a total thickness variation of less than 2.0 μm and comprises an information identification part formed of a plurality of dots, wherein the dots are formed by cracks extending from an inside of the glass substrate to a surface layer thereof.

TABLE 1

| | | No. 1 | No. 2 | No. 3 | No. 4 | No. 5 | No. 6 | No. 7 |
|---|---|---|---|---|---|---|---|---|
| Component (wt %) | $SiO_2$ | 65.0 | 63.2 | 65.3 | 64.0 | 60.0 | 58.4 | 61.4 |
| | $Al_2O_3$ | 8.2 | 8.0 | 8.0 | 8.0 | 16.7 | 13.0 | 18.0 |
| | $B_2O_3$ | 13.5 | 13.1 | 8.6 | 13.3 | 9.8 | 0.0 | 0.5 |
| | MgO | 0.0 | 0.0 | 0.0 | 0.0 | 0.8 | 2.0 | 3.0 |
| | CaO | 3.3 | 3.2 | 3.2 | 3.2 | 8.0 | 2.0 | 0.0 |
| | SrO | 0.0 | 0.0 | 0.0 | 0.0 | 4.5 | 0.0 | 0.0 |
| | ZnO | 0.9 | 0.9 | 0.9 | 1.0 | 0.0 | 0.0 | 0.0 |
| | $Na_2O$ | 8.7 | 11.3 | 13.6 | 10.1 | 0.0 | 14.5 | 14.5 |
| | $K_2O$ | 0.0 | 0.0 | 0.0 | 0.0 | 0.0 | 5.5 | 2.0 |
| | $ZrO_2$ | 0.0 | 0.0 | 0.0 | 0.0 | 0.0 | 4.5 | 0.0 |
| | $Sb_2O_3$ | 0.1 | 0.0 | 0.1 | 0.1 | 0.0 | 0.0 | 0.0 |
| | $SnO_2$ | 0.3 | 0.3 | 0.3 | 0.3 | 0.2 | 0.0 | 0.7 |
| $\alpha_{30-380}$ (×$10^{-7}$/° C.) | | 59 | 68 | 77 | 64 | 38 | 102 | 91 |
| ρ (g/cm$^3$) | | 2.39 | 2.43 | 2.47 | 2.41 | 2.46 | 2.54 | 2.45 |
| Ps (° C.) | | 535 | 530 | 530 | 530 | 673 | 533 | 564 |
| Ta (° C.) | | 570 | 565 | 565 | 565 | 725 | 576 | 613 |
| Ts (° C.) | | 755 | 730 | 735 | 740 | 943 | 793 | 863 |
| $10^{4.0}$ dPa·s (° C.) | | 1,095 | 1,050 | 1,045 | 1,065 | 1,256 | 1,142 | 1,255 |
| $10^{3.0}$ dPa·s (° C.) | | 1,305 | 1,240 | 1,240 | 1,265 | Unmeasured | 1,319 | 1,460 |
| $10^{2.5}$ dPa·s (° C.) | | 1,450 | 1,385 | 1,380 | 1,410 | 1,519 | 1,431 | 1,591 |
| $10^{2.0}$ dPa·s (° C.) | | 1,640 | 1,570 | 1,540 | 1,595 | Unmeasured | Unmeasured | Unmeasured |
| TL (° C.) | | 890 | 802 | 800 | 850 | Unmeasured | 880 | 970 |
| E (GPa) | | 71 | 74 | 75 | 75 | 75 | 75 | 71 |

2. The glass substrate according to claim 1, wherein the dots are formed by thermal shock through laser irradiation.

3. The glass substrate according to claim 1, wherein the dots adjacent to each other have a distance between centers of 100 µm or less.

4. The glass substrate according to claim 1, wherein the dots each have a diameter of from 0.5 µm to 10 µm.

5. The glass substrate according to claim 1, wherein the information identification part has input therein one kind or two or more kinds of information selected from a manufacturing company name of the glass substrate, a material of the glass substrate, a thermal expansion coefficient of the glass substrate, an outer diameter of the glass substrate, a thickness of the glass substrate, the total thickness variation of the glass substrate, a manufacturing date of the glass substrate, a delivery date of the glass substrate, and a serial number of the glass substrate.

6. The glass substrate according to claim 1, wherein the glass substrate has a warpage level of 60 µm or less.

7. The glass substrate according to claim 1, wherein all or part of a surface of the glass substrate comprises a polished surface.

8. The glass substrate according to claim 1, wherein the glass substrate further comprises a formed joined surface in an inside of glass.

9. The glass substrate according to claim 1, wherein the glass substrate has a contour of a wafer shape.

10. The glass substrate according to claim 1, wherein the glass substrate is used for supporting a substrate to be processed in a manufacturing process for a semiconductor package.

11. A laminate, comprising at least a substrate to be processed and a glass substrate configured to support the substrate to be processed, the glass substrate comprising the glass substrate of claim 1.

12. The laminate according to claim 11, wherein the substrate to be processed comprises at least a semiconductor chip molded with a sealing material.

13. A method of manufacturing a glass substrate, the method comprising the steps of:
(1) cutting a mother glass sheet to provide a glass substrate;
(2) polishing a surface of the glass substrate so that the glass substrate has a total thickness variation of less than 2.0 µm; and
(3) forming cracks extending from an inside of the glass substrate to a surface layer thereof by thermal shock through laser irradiation to form an information identification part formed of a plurality of dots.

* * * * *